United States Patent
Singh et al.

(10) Patent No.: US 7,134,105 B2
(45) Date of Patent: Nov. 7, 2006

(54) MULTIPLE LEVEL TRANSISTOR ABSTRACTION FOR DYNAMIC CIRCUITS

(75) Inventors: Manish Singh, Sunnyvale, CA (US); Arun Chandra, Cupertino, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 278 days.

(21) Appl. No.: 10/747,013

(22) Filed: Dec. 9, 2003

(65) Prior Publication Data

US 2005/0125185 A1    Jun. 9, 2005

(51) Int. Cl.
*G06F 17/50* (2006.01)
(52) U.S. Cl. .................. 716/4; 716/3; 716/12; 717/124
(58) Field of Classification Search .................... 716/4, 716/3, 12; 717/124
See application file for complete search history.

(56) References Cited

U.S. PATENT DOCUMENTS

| | | | |
|---|---|---|---|
| 6,305,003 B1 * | 10/2001 | McBride ...................... | 716/12 |
| 6,470,482 B1 | 10/2002 | Rostoker et al. ............... | 716/6 |
| 6,493,852 B1 | 12/2002 | Narain et al. .................. | 716/5 |
| 6,711,722 B1 * | 3/2004 | Parashkevov et al. ......... | 716/3 |
| 6,760,891 B1 * | 7/2004 | Chng ............................. | 716/4 |
| 6,848,090 B1 * | 1/2005 | Jain et al. ....................... | 716/3 |
| 6,851,095 B1 * | 2/2005 | Srinivasan et al. ............ | 716/4 |
| 2003/0110458 A1 * | 6/2003 | Jain et al. ....................... | 716/4 |

OTHER PUBLICATIONS

Jolly, Simon, et al., "Automated Equivalence Checking of Switch Level Circuits," Design Automation Conference, Jun. 10-14, 2002.

Kuehlmann, Andreas, et al., "Verity—A formal verification program for custom CMOS circuits," IBM J. Res. Develop., vol. 39, No. 1/2, Jan./Mar. 1995, pp. 149-165.

* cited by examiner

*Primary Examiner*—A. M. Thompson
*Assistant Examiner*—Nelson Lam
(74) *Attorney, Agent, or Firm*—Hamilton & Terrile, LLP; Gary W. Hamilton

(57) ABSTRACT

A method and apparatus for improved formal equivalence checking to verify the operation of components in a VLSI integrated circuit. The present invention enhances previous techniques for dynamic circuits by generating a multi-level transistor abstraction for dynamic circuits. Two-levels of abstracted code are generated. First, an abstracted legal Verilog® is generated for the evaluate phase of a dynamic circuit. Second, "comment-logic" in Verilog® syntax is generated for the pre-charge phase of the dynamic circuit. Using the method and apparatus of the present invention, it is possible to obtain a multi-level transistor abstraction for both the "clk=0" and the "clk=1" conditions. The binary decision diagram property of the circuit being analyzed is used to generate multi-level representations for both the pre-charge (clk=0) and the evaluate phases (clk=1). The multi-level abstracted model of the present invention has several advantages over the prior art. The legal Verilog® can be used for traditional simulation and equivalency verification, ATPG. The "comment logic" can be used with a property checking tool to verify that the clock connectivity is correct. In addition, the present invention has the advantage of being able to generate legal Verilog® with pre-charge for verification against RTL with detailed pre-charge information.

12 Claims, 5 Drawing Sheets

Binary Decision Diagram
CLK = 0

Binary Decision Diagram
CLK = 1

MULTIPLE LEVEL TRANSISTOR ABSTRACTION FOR DYNAMIC CIRCUITS

FIELD OF THE INVENTION

The present invention relates generally to the field of integrated circuit design and fabrication. More specifically, the present invention provides an improved method and apparatus for simulation and testing of integrated circuits and systems.

BACKGROUND OF THE INVENTION

With the constant increase in digital circuit complexity, multiple levels of abstraction in circuit representation are typically needed. Register-Transfer Level (RTL) is a technique for describing a circuit at a high level of Boolean functionality and data flow. RTL is one of the preferred abstraction levels for certain kinds of functional designs. Although an RTL design can provide a reference for design implementation, it must be translated into an equivalent switch level design to fabricate the actual integrated circuit.

Gate level and switch level representations are two other forms of circuit representations that are commonly used in simulation of the operation of integrated circuits. A gate level representation can be used to provide a schematic description of circuit components as interconnections of basic blocks having known Boolean functionalities. A switch level representation provides a representation of switches (transistors) and gates that implement the desired functionality for a particular circuit. For an integrated circuit to meet strict operating criteria in terms of speed, power, and surface area, it is generally necessary to create custom designs at the switch level. However, traditional techniques for verifying such designs are generally expensive and can incur errors.

"Formal verification" techniques can be used to prove the accuracy of the design and generally require less effort and computer resources than traditional verification techniques. "Formal equivalence checking" is one of the most widely used formal verification techniques for VLSI design. Most current tools employ formal methods at the RTL and gate level. This paradigm is acceptable for many ASIC designs that rely on logic synthesis. However, in custom VLSI design, many circuits are entered at the transistor-level to meet high performance goals.

To run formal equivalence checking on custom circuits, an important phase is Transistor-Level Abstraction. Transistor-level abstraction is defined as the process of understanding and translating a transistor netlist to a high-level representation (suitable for simulation by tools such as Verilog®). Common uses for transistor-level abstraction are switch-level simulation, equivalence checking, and ATPG.

An important requirement for abstraction is the ability to understand and "abstract" dynamic CMOS circuits. In order to achieve this, current tools use the Pre-charge Recognition methodology. This is usually done via clock propagation to identify pre-charge nodes. The current tools either abstract the pre-charge logic as part of the design, or eliminate it to match the RTL. Following that step, an equivalence check can be performed on either an RTL with no pre-charge information, or an RTL with detailed pre-charge information.

SUMMARY OF INVENTION

The method and apparatus of the present invention provides an improvement in formal equivalence checking to verify the operation of components in a VLSI integrated circuit. Specifically, the present invention enhances previous techniques for verifying the operation of dynamic circuits by generating a multi-level transistor abstraction for dynamic circuits. In the method and apparatus of the present invention, two-levels of abstracted code are generated. First, an abstracted legal Verilog® code (or code from another comparable tool) is generated for the evaluate phase of a dynamic circuit. Second, "comment-logic" in Verilog® syntax is generated for the pre-charge phase of the dynamic circuit.

Using the method and apparatus of the present invention it is possible to obtain a multi-level transistor abstraction because, unlike previous techniques, the binary decision diagram (BDD), is stored and used for both the "clk=0" and the "clk=1" conditions. The BDD constraint property is then used to generate multi-level representations for both the pre-charge phase and the evaluate phase.

The multi-level abstracted model of the present invention has several advantages over the prior art. The legal Verilog® code can be used for traditional simulation, equivalency verification, and ATPG. The "comment logic" code can be used with a property checking tool to verify that the clock connectivity is correct. In addition, the present invention has the advantage of being able to generate legal Verilog® with pre-charge for verification against RTL with detailed pre-charge information.

Other aspects and advantages of the invention will be apparent from the following description and the appended claims.

DETAILED DESCRIPTION

Figure 1:
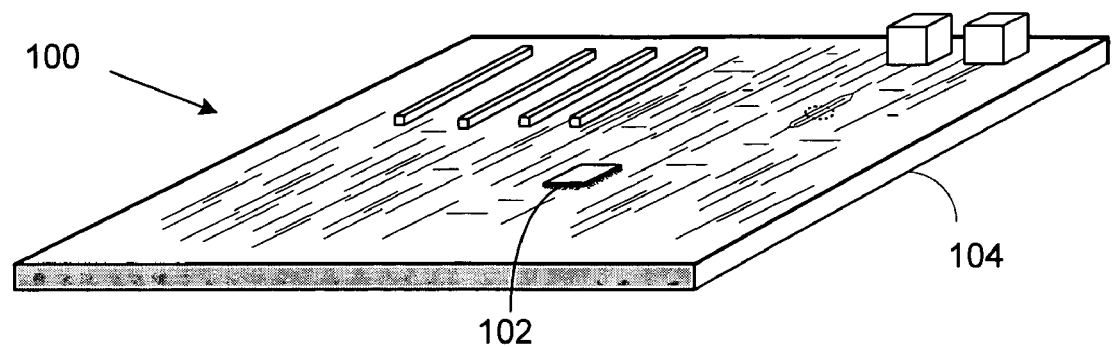
FIG. 1 is an illustration of an electronic system comprising a plurality of integrated circuit components fabricated in accordance with the method and apparatus of the present invention.
Figure 2:
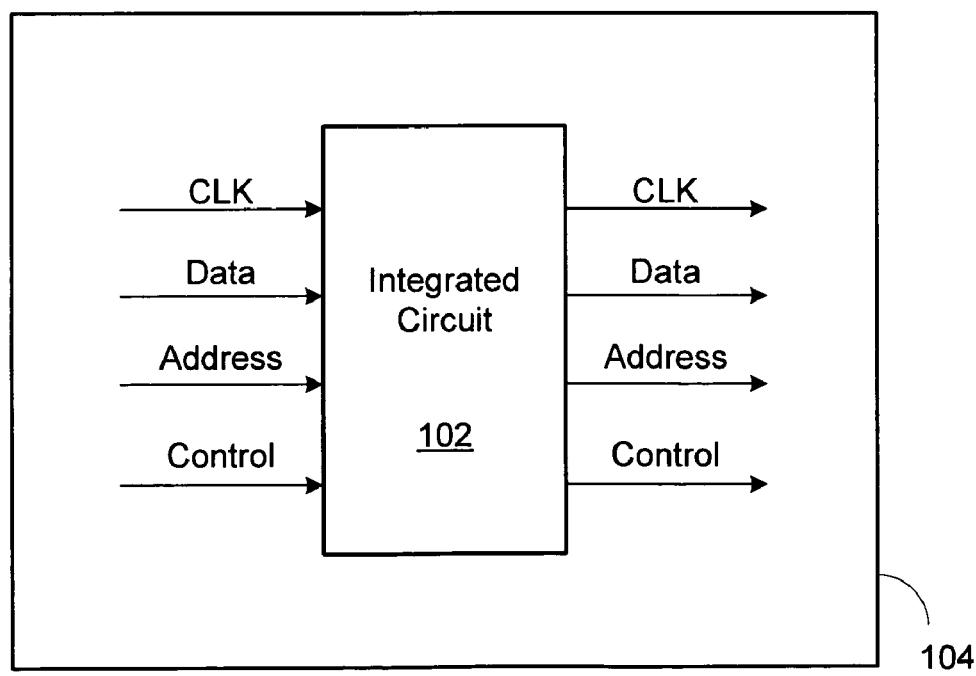
FIG. 2 is a block diagram of an integrated circuit illustrating a plurality of input and output signals.

FIG. 1 is an illustration of an electronic system comprising a plurality of integrated circuit components fabricated in accordance with the method and apparatus of the present invention. A plurality of integrated circuits 102 are operably connected to a circuit board 104. FIG. 2 is a block diagram representation of the integrated circuit 102 illustrating a plurality of input and output signals. In order to ensure the proper operation of the integrated circuit 102, it is necessary to simulate the operation of the circuit using a simulation tool, such as Verilog® or a comparable simulation tool. As discussed hereinabove, as integrated circuits increase in complexity, multiple levels of abstraction in circuit representation are typically needed to verify proper operation of the circuits prior to fabrication. To accomplish this, a "netlist" is created for the various functional blocks within the integrated circuit. As will be understood by those of skill in the art, a "netlist" is a list of logic gates and their interconnections that make up a circuit. To create a netlist it is necessary to generate a code listing using an appropriate tool, such as Verilog® or a similar simulation tool for each of the functional blocks of the integrated circuit.

Figure 3A:
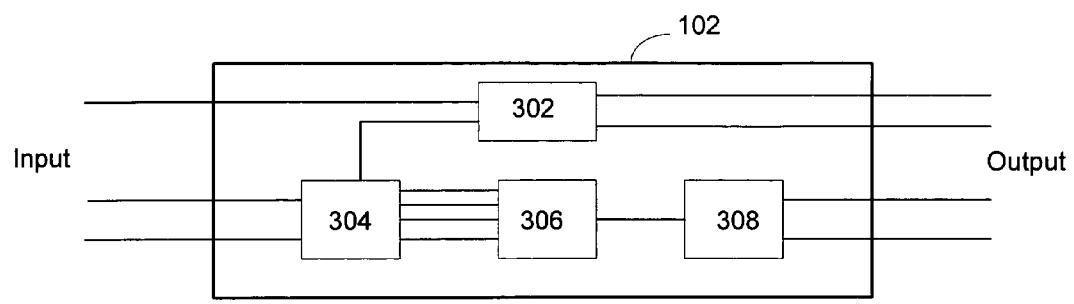
FIG. 3A is a block diagram of a plurality of system components of the integrated circuit shown in FIG. 2.

FIG. 3A is a conceptual block diagram illustrating a plurality of circuit modules 302, 304, 306 and 308 that are contained in the integrated circuit 102. While it is not necessary to describe the specific functions of the modules 302, 304, 306 and 308 with regard to the present invention, it will be understood by those of skill in the art that each of these modules contain logic circuits such as the "OR" gates 310, 312 and the "NAND" gate 314 illustrated in FIG. 3B. The operation of such logic circuits in each of the modules of integrated circuit 102 must be represented in an appropriate netlist code. For purposes of illustrating the present invention, the NAND gate 314 of FIG. 3B will be discussed hereinbelow.

A pre-charge (or dynamic) net has two distinct phases of operation: the pre-charge phase and the evaluate phase. The pre-charge phase is assumed to be the first phase of the dynamic clocking scheme, during which the pre-charge net is unconditionally charged to either logical 1 or logical 0. The evaluate phase is assumed to be the last phase of the dynamic clocking scheme, during which the pre-charged net is conditionally discharged, so that it maintains its pre-charge logic level if the required conditions for discharge are not satisfied. Any dynamic clock phases between the pre-charge and evaluate phases are assumed to be transient, and do not contribute to the required output model.

Figure 3B:
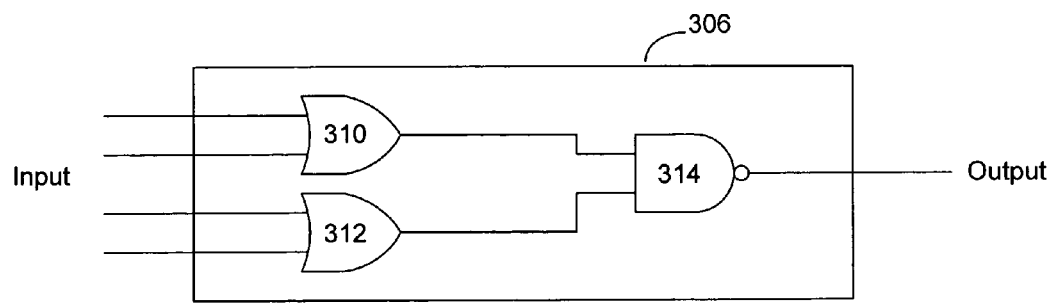
FIG. 3B is a block diagram of a plurality of logic components contained in one of the system component blocks illustrated in FIG. 3A.
Figure 4B:
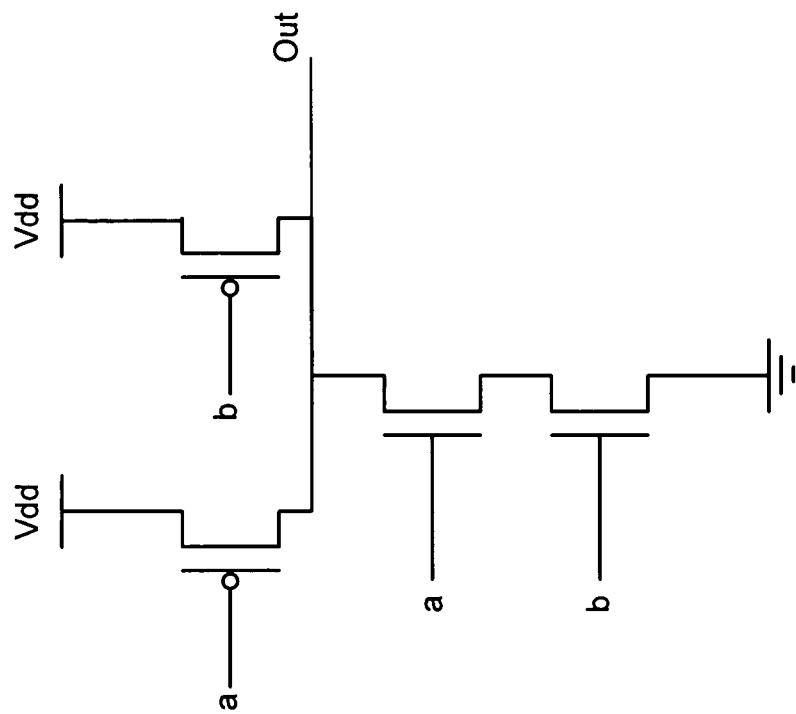
FIG. 4B is an illustration of a static representation of the NAND gate shown in FIG. 3B.
Figure 4A:
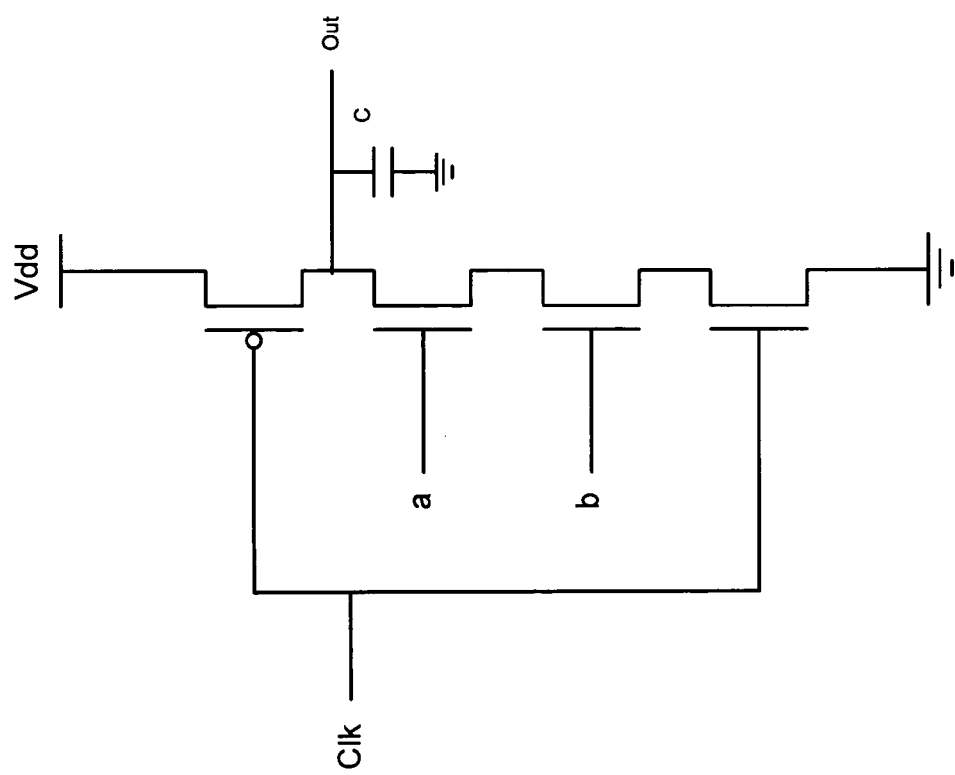
FIG. 4A is an illustration of a dynamic representation of the NAND gate shown in FIG. 3B.

FIG. 4A is a schematic illustration of a dynamic representation of the NAND gate 314 shown in FIG. 3B. FIG. 4A illustrates a typical example of pre-charge logic in which the net labeled 'out' is a pre-charge net. During the pre-charge phase, the dynamic clock input 'clk' is logical 0. The capacitor 'C' is pre-charged to logical 1 since there are no conducting paths to a supply of logical 0 and there is a conducting path to a supply of logical 1. In the evaluate phase, the dynamic clock input is logical 1. If 'a' and 'b' are both logical 1, then there is a path to a supply of logical 0 and 'C' is discharged. Otherwise 'C' maintains a logical 1. This implements a NAND logic gate such as the NAND gate 314 in FIG. 3B.

The presence of logic that is dependent on dynamic clocks in the discharging network, and which prevents discharge paths from conducting in the pre-charge phase of the clocking scheme is referred to as 'footed' pre-charge logic. The example shown in FIG. 4A illustrates footed pre-charge logic due to the NMOS transistor that prevents the discharge path in the pre-charge phase when 'clk' is logical 0. The absence of footing logic is referred to as 'non-footed' pre-charge logic.

The major tasks in the analysis of pre-charge logic are: 1) to identify nets that are pre-charged and analyze under a dynamic clocking scheme (termed 'pre-charge nets'), and 2) for each pre-charge net, to derive the pre-charge functionality and obtain the static behavior. FIG. 4B is a schematic of a static representation of the NAND gate 314 shown in FIG. 3B.

Figure 5A:
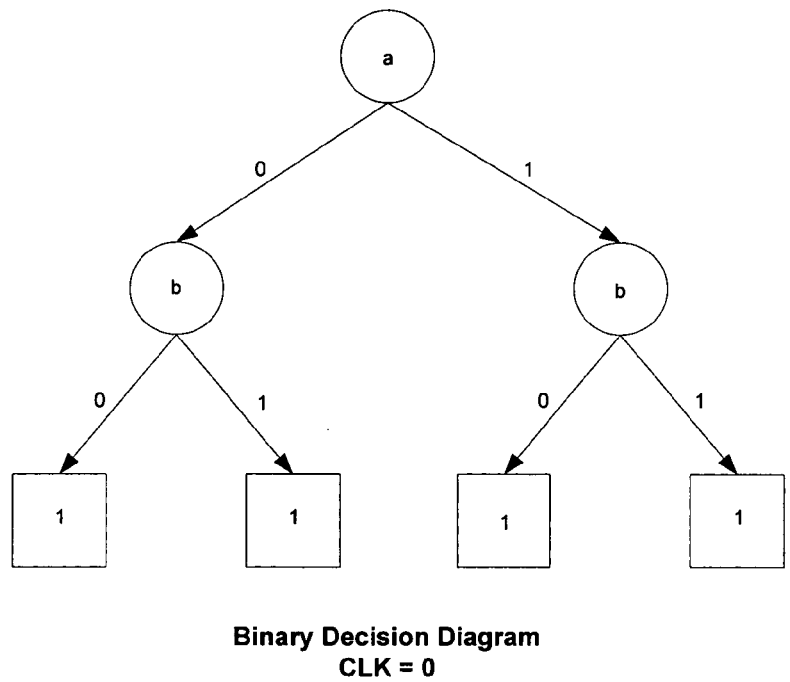
FIG. 5A is a BDD representation of the dynamic representation of the NAND circuit of FIG. 4A for clk=0.
Figure 5B:
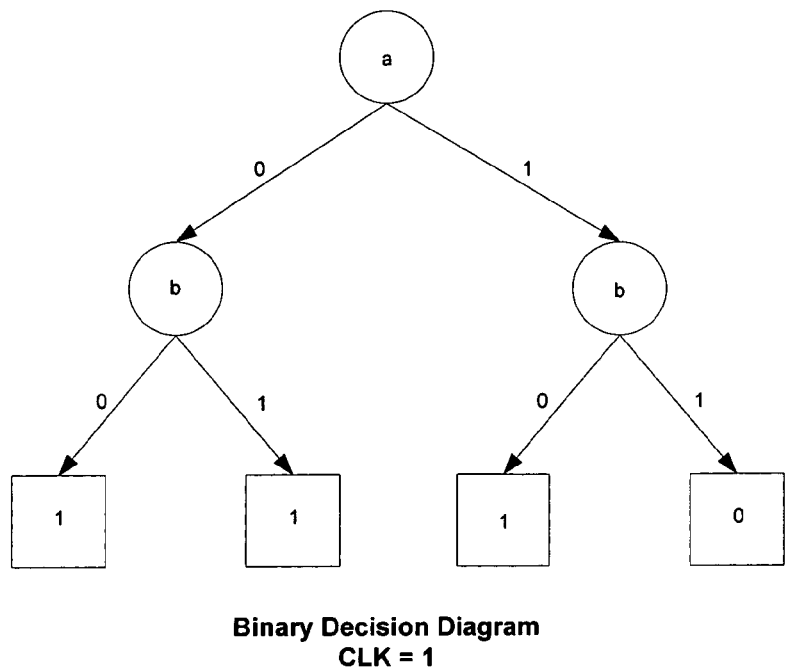
FIG. 5B is a BDD representation of the dynamic representation of the NAND circuit of FIG. 4A for clk=1.

FIG. 5A is a binary decision diagram (BDD) for the pre-charge phase of the dynamic representation of a NAND gate 314, where the clock=0. FIG. 5B is a BDD for the evaluate phase, where the clock=1. These BDD representations provide the basis for verifying the NAND gate 314 using the method and apparatus of the present invention.

In the method and apparatus of the present invention, two-levels of abstracted code are generated to produce a multi-level abstraction for dynamic circuits. First, an abstracted legal Verilog® code (or code from another comparable tool) is generated for the evaluate phase of a dynamic circuit. Second, "comment-logic" in Verilog® syntax is generated for the pre-charge phase of the dynamic circuit. Multi-pass testing can be used to verify the correctness of the design. In the first pass, the value of the clock is equal to "0" and in the second pass the value of the clock is equal to "1." The first pass verifies the pre-charge phase and the second pass verifies the evaluate phase. In addition, code contained in "comment logic" can be used to verify the clock connectivity of pre-charge logic using an appropriate property checking tool.

An example of code for implementing the present invention on a logic circuit, such as the NAND gate 314, is shown below. The dynamic circuit for the NAND gate 314, is abstracted to:

```
module tran_abstract-01 (out, a, b);
output out;
input a, b;
//CLOCK_PROPERTY_CHECK
//if (clk ==  0)
//out = 1
out = ! (a & b);
endmodule
```

Figure 6:
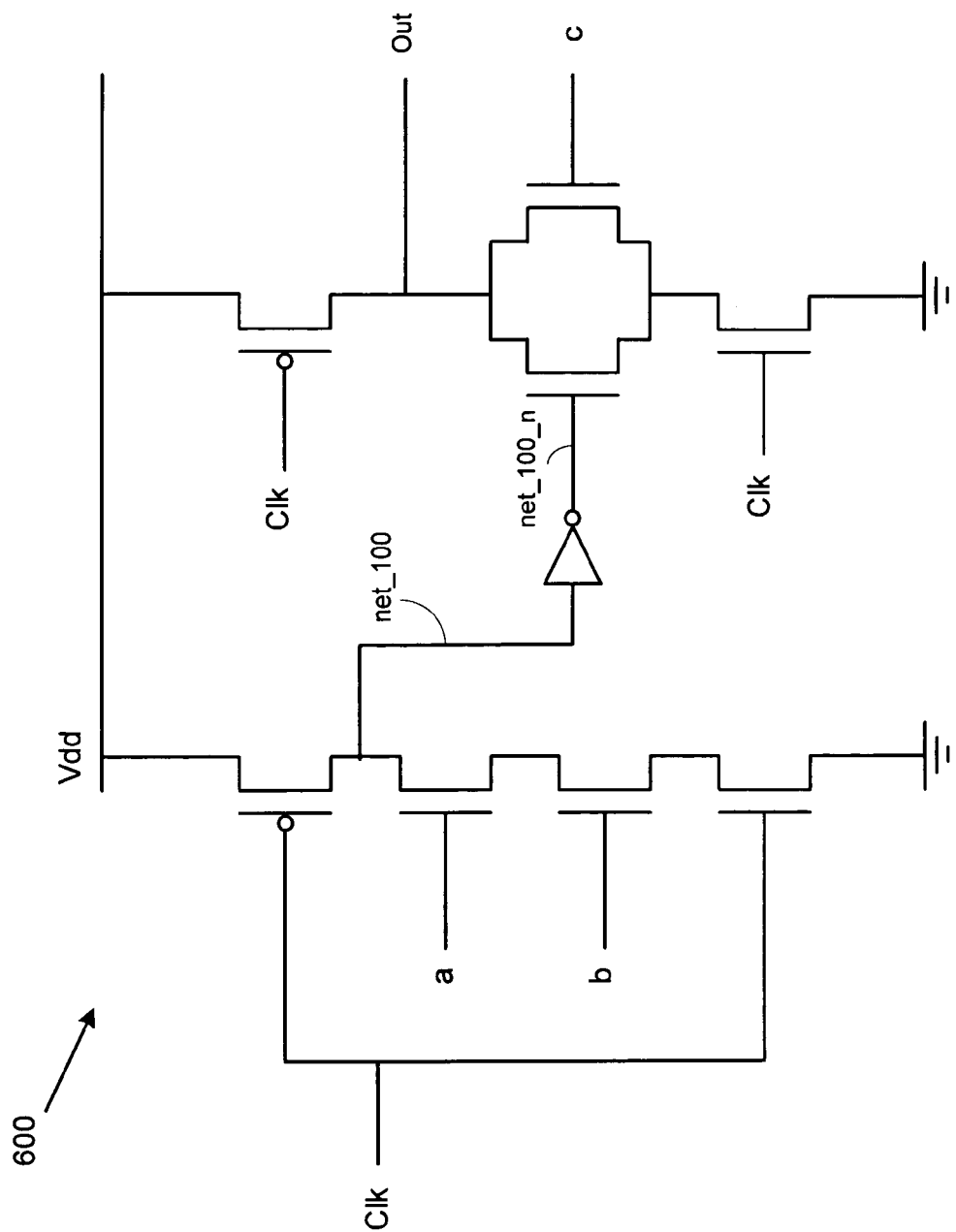
FIG. 6 is a dynamic representation of a logic circuit.

Another example of code for implementing the present invention on a logic circuit 600 illustrated in FIG. 6 is shown below. The dynamic representation of the circuit 600, is abstracted to:

```
module tran_abstract-02 (out, a, b,c);
output out;
input a, b, c;
wire net_100, net_100_n;
//CLOCK_PROPERTY_CHECK1
//if (clk ==  0)
//out = 1
//CLOCK_PROPERTY_CHECK2
//if (clk ==  0)
//net_100 = 1
//CLOCK_PROPERTY_CHECK3
//if (clk ==  0)
//net_100_n = 0
net_100 = !(a & b);
net_100_n = !net_100
out = ! (c|net_100_n);
endmodule
```

Using the method and apparatus of the present invention it is possible to obtain a multi-level transistor abstraction because, unlike previous techniques, the binary decision diagram (BDD), is stored and used for both the "clk=0" and the "clk=1" conditions. The BDD constraint property is then used to generate multi-level representations for both the pre-charge phase and the evaluate phase.

The multi-level abstracted model of the present invention has several advantages over the prior art. The legal Verilog® code can be used for traditional simulation, equivalency verification, and ATPG. The "comment logic" code can be used with a property checking tool to verify that the clock connectivity is correct. In addition, the present invention has the advantage of being able to generate legal Verilog® with pre-charge for verification against RTL with detailed pre-charge information. In addition, the method and apparatus of the present invention makes it possible to perform simulation and verification of the circuitry using a single netlist, while using multiple passes and multiple tools to verify implantations of the static and dynamic behavior of the integrated circuit.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A method for verifying operation of circuit modules in an integrated circuit, comprising:
    (a) generating a first level of abstracted code corresponding to the pre-charge phase of a dynamic circuit, said first level of abstracted code comprising code embedded in comment logic;
    (b) generating a second level of abstracted code corresponding to the evaluate phase of a dynamic circuit; and
    (c) performing multi-pass processing comprising first and second processing passes of said first and second levels of abstracted code to obtain a transistor abstraction verification of the operation of said circuit with respect to said pre-charge phase and said evaluate phase;
    (d) wherein said second level of abstracted code corresponding to said evaluate phase comprises code having a syntax executable in conjunction with a property checking tool and wherein said embedded code is executable in conjunction with said property checking tool.

2. The method of claim 1, wherein said first level of abstracted code comprises executable code corresponding to a dynamic clocking scheme wherein a pre-charge net is unconditionally charged to a logical 1 or a logical 0.

3. The method of claim 2, wherein said second level of abstracted code comprises executable code corresponding to a dynamic clocking scheme wherein a pre-charge net is conditionally discharged.

4. The method of claim 3, wherein said second level of abstracted code corresponding to said evaluate phase comprises legal Verilog code.

5. The method of claim 4, wherein verification of said pre-charge phase is structured in accordance with a binary decision tree corresponding to the state of said circuit module wherein a clock signal has a value of "0."

6. The method of claim 5, wherein said verification of said evaluate phase is structured in accordance with a binary decision tree corresponding to the state of said circuit module wherein a clock signal has a value of "1."

7. An integrated circuit, comprising:
    a plurality of circuit components for processing data signals in accordance with a timing sequence controlled by at least one clock signal;
    wherein operation of said integrated circuit is verified by:
    (a) generating a first level of abstracted code corresponding to the pre-charge phase of a dynamic circuit, said first level of abstracted code comprising code embedded in comment logic;
    (b) generating a second level of abstracted code corresponding to the evaluate phase of a dynamic circuit; and
    (c) performing multi-pass processing comprising first and second processing passes of said first and second levels of abstracted code to obtain a transistor abstraction verification of the operation of said circuit with respect to said pre-charge phase and said evaluate phase;
    (d) wherein said second level of abstracted code corresponding to said evaluate phase comprises code having syntax executable in conjunction with a property checking tool and wherein said embedded code is executable in conjunction with said property checking tool.

8. The integrated circuit of claim 7, wherein said first level of abstracted code comprises executable code corresponding to a dynamic clocking scheme wherein a pre-charge net is unconditionally charged to a logical "1" or a logical "0."

9. The integrated circuit of claim 8, wherein said second level of abstracted code comprises executable code corresponding to a dynamic clocking scheme wherein a pre-charge net is conditionally discharged.

10. The integrated circuit of claim 9, wherein said second level of abstracted code corresponding to said evaluate phase comprises legal Verilog code.

11. The integrated circuit of claim 10, wherein verification of said pre-charge phase is structured in accordance with a binary decision tree corresponding to the state of said circuit module wherein a clock signal has a value of "0."

12. The integrated circuit of claim 11, wherein said verification of said evaluate phase is structured in accordance with a binary decision tree corresponding to the state of said circuit module wherein a clock signal has a value of "1."

* * * * *